(12) United States Patent
Sauciuc et al.

(10) Patent No.: US 7,779,638 B2
(45) Date of Patent: Aug. 24, 2010

(54) LOCALIZED MICROELECTRONIC COOLING APPARATUSES AND ASSOCIATED METHODS AND SYSTEMS

(75) Inventors: Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1126 days.

(21) Appl. No.: 11/319,297

(22) Filed: Dec. 27, 2005

(65) Prior Publication Data
US 2007/0144182 A1   Jun. 28, 2007

(51) Int. Cl.
*F25B 21/02* (2006.01)
(52) U.S. Cl. .................................. 62/3.2; 62/259.2
(58) Field of Classification Search ............. 62/3.2, 62/3.3, 3.7, 259.2; 257/712, 717; 228/180.1, 228/214; 165/80.3, 104.33; 361/100, 161, 361/162, 169.1
See application file for complete search history.

(56) References Cited

U.S. PATENT DOCUMENTS

| | | | | |
|---|---|---|---|---|
| 3,008,300 A | * | 11/1961 | Ryan et al. | 62/3.3 |
| 5,063,476 A | * | 11/1991 | Hamadah et al. | 361/697 |
| 5,417,362 A | * | 5/1995 | Chiyonobu et al. | 228/180.1 |
| 5,864,466 A | * | 1/1999 | Remsburg | 361/700 |
| 6,118,657 A | * | 9/2000 | Clemens | 361/697 |
| 6,432,497 B2 | * | 8/2002 | Bunyan | 428/40.1 |
| 2002/0012762 A1 | * | 1/2002 | Bunyan | 428/40.2 |
| 2006/0075969 A1 | * | 4/2006 | Fischer | 118/725 |

OTHER PUBLICATIONS

U.S. Appl. No. 11/174,313; filed Jun. 30, 2005; Inventor: Thomas Fitzgerald.
U.S. Appl. No. 11/255,678; filed Oct. 20, 2005; Inventor: Ioan Sauciuc.
Bierschenk et al—2004—Extending the Limits of Air Cooling With Thermoelectrically Enhanced Heat Sinks; pp. 679-684.

* cited by examiner

Primary Examiner—Mohammad M Ali
(74) Attorney, Agent, or Firm—Kathy J. Ortiz

(57) ABSTRACT

Apparatuses and associated methods and systems to provide localized cooling to a microelectronic device are generally described. In this regard, according to one example embodiment, a microelectronic cooling apparatus comprising a microelectronic device thermally coupled to one or more thermally conductive pin(s) provides cooling to one or more hot spot(s) of the microelectronic device.

23 Claims, 3 Drawing Sheets

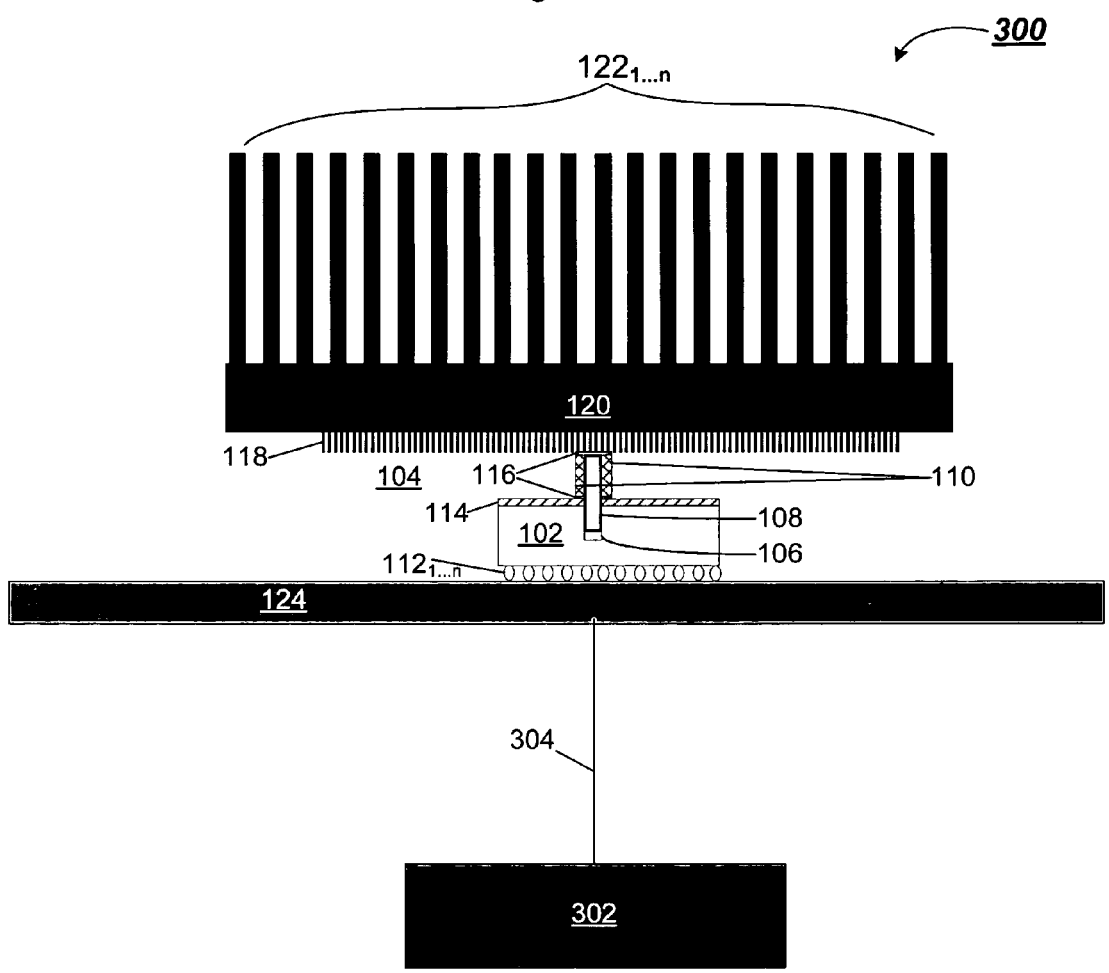

Figure 1:
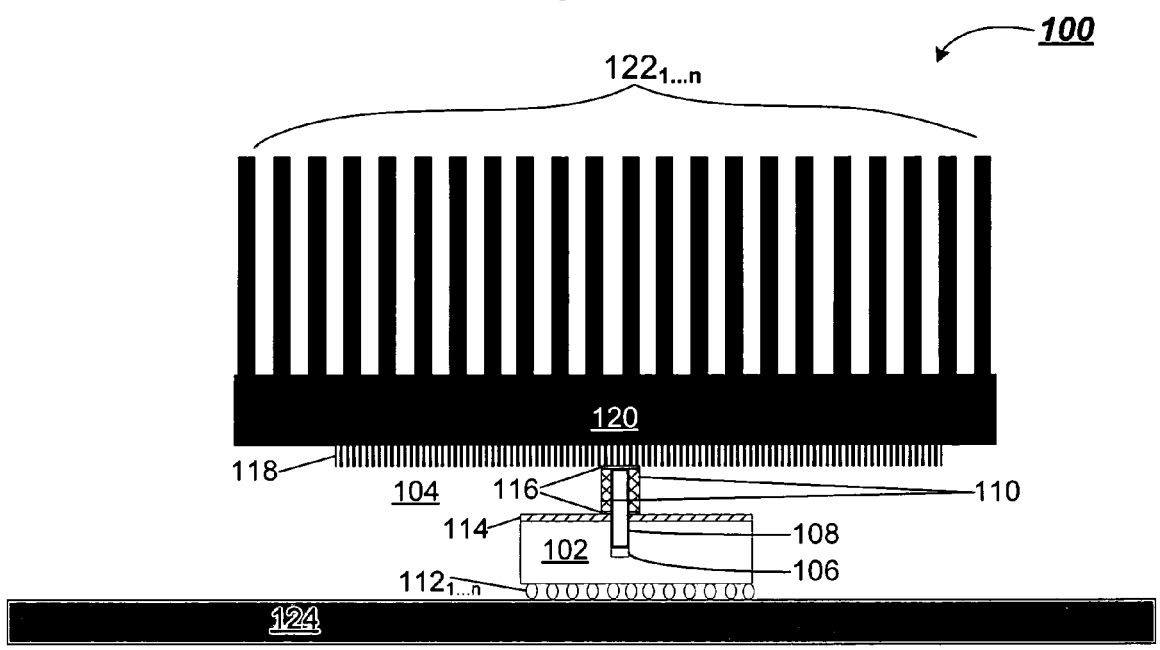

LOCALIZED MICROELECTRONIC COOLING APPARATUSES AND ASSOCIATED METHODS AND SYSTEMS

TECHNICAL FIELD

Embodiments of the present invention are generally directed to microelectronic cooling systems and, more particularly, to an apparatus and associated method for localized microelectronic cooling.

BACKGROUND

Microelectronic devices generate heat as a result of the electrical activity of the internal circuitry. In order to reduce the damaging effects of this heat, thermal management systems have been developed to remove the heat. Such thermal management systems have included heat sinks, heat spreaders, fans, and various combinations that are adapted to thermally couple with the microelectronic device.

With the development of faster, more powerful, and more densely packed microelectronic devices such as processors, traditional methods of cooling may be ineffective, inefficient, or impractical. For example, processors may have local high heat flux regions called hot spots that create elevated and non-uniform temperature distributions within the die package and cooling system. Resultant overheating compromises the reliability and speed of such devices. Hot spots may need better cooling than traditional cooling methods can provide. In this regard, improved cooling technologies are needed to remove the generated heat from localized hot spots of microelectronic devices to prevent overheating.

Thermoelectric coolers (TEC) and associated techniques are emerging as an improved thermal solution for high-power, densely populated microelectronic devices such as processors and other integrated circuit dies. A thermoelectric cooler may have a cold side where heat is absorbed by electrons as they pass from a low energy level in a p-type semiconductor element, to a higher energy level in an n-type semiconductor element. A power supply may provide the energy to move the electrons through the system. At a hot side, energy may be expelled to a heat sink as electrons move from a high energy level element (n-type) to a lower energy level element (p-type).

Application of conventional TECs to hot spot cooling may be desirable. However, a conventional TEC, alone, may not provide sufficient heat removal for localized hot spots. Improvements are needed to facilitate the application of conventional TECs to hot spot cooling. A reliable, high performance, heat spreading material with no moving parts may facilitate the application of conventional TECs to hot spot cooling.

BRIEF DESCRIPTION OF THE DRAWINGS

Embodiments of the present invention are illustrated by way of example, and not by way of limitation, in the figures of the accompanying drawings in which like reference numerals refer to similar elements and in which:

FIG. 1 is a side view of an example microelectronic cooling system applied to an example die package configuration, according to but one example embodiment;

FIG. 2 is a flow chart of an example method to fabricate a localized microelectronic cooling system, according to but one example embodiment; and FIG. 3 is a side view of another example microelectronic cooling system applied to an example die package configuration, according to but one example embodiment;

DETAILED DESCRIPTION

Embodiments of a microelectronic cooling apparatus and corresponding methods are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of various embodiments of the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 provides a side view of an example microelectronic cooling system applied to an example die package configuration 100, according to but one example embodiment. In the illustrated embodiment, a microelectronic cooling system 100 may comprise microelectronic die 102, heat spreader 104, hot spot 106, one or more thermally conductive pin(s) 108, one or more thermoelectric cooler(s) (TEC) 110, array of solder balls $\mathbf{112}_{1 \ldots n}$ (where n represents a variable number of repeating structures), first-level thermal interface material (TIM1) 114, solder bond(s) 116, second-level thermal interface material (TIM2) 118, heat sink 120 with array of fins $\mathbf{122}_{1 \ldots n}$ (where n represents a variable number of repeating structures), and substrate 124, each coupled as shown. Array of solder balls $\mathbf{112}_{1 \ldots n}$ may provide one or more electrical power and/or signal connections between die 102 and another component such as substrate 124.

In alternative embodiments as depicted in FIG. 3, microelectronic die 102 may be electrically coupled by any suitable manner 304 to various other systems, components, or devices 302 such as another microelectronic die, for example. In another embodiment, microelectronic die 102 may be electrically coupled to a memory device. Such electrical coupling may comprise direct coupling to a microelectronic die 102 or may comprise one or more electrical connections between a microelectronic die 102 and through another component such as substrate 124 before electrically coupling to another device 302.

In an embodiment of FIG. 1, one or more thermally conductive pin(s) 108 may be thermally coupled to one or more hot spot(s) 106 of a microelectronic device 102 to provide localized cooling. Heat from the one or more hot spot(s) 106 may be transferred to the thermally conductive pin(s) 108. The one or more pin(s) 108 may provide a high thermal conductivity path away from the one or more hot spot(s) 106. The pin(s) 108 may then be cooled by one or more TEC(s) 110 that are thermally coupled to the pin(s). The one or more TEC(s) 100 may be thermally coupled to a heat spreader 104. The TEC(s) 110 may be embedded in heat spreader 104 as depicted. TEC(s) 110 and heat spreader 104 may be cooled by a conventional heat sink 120, $\mathbf{122}_{1 \ldots n}$ that is thermally coupled to the heat spreader 104 and TEC(s) 110.

The one or more thermally conductive pin(s) 108 may be designed and formed in various shapes and dimensions and may comprise various materials. For example, the pin(s) 108 may be rectangular or cylindrical, symmetrical or asymmetrical. Factors considered for the pin(s) dimension, shape, and material may include manufacturability, cost, and heat transfer considerations (i.e. —desired contact surface area) of the pin(s) and the size, location, and heat transfer requirements of the hot spot 106 and associated microelectronic device 102.

The contact area between the pin(s) 108 and hot spot(s) 106 may be increased to increase heat transfer to the pin(s) 108. In one embodiment, pin(s) 108 may be threaded to improve contact and help secure the pin(s) 108 to the microelectronic device 102, and increase heat transfer area from the hot spot(s) 106 to pin(s) 108. In another embodiment, pin(s) 108 may be rounded to increase heat transfer area between the hot spot(s) 106 and pin(s) 108 and, thus, improve heat transfer from the hot spot(s) 106 to pin(s) 108.

Likewise, the contact area between the pin(s) 108 and TEC(s) 110 may be increased to improve heat transfer to the TEC(s) 110. The pin(s) 108 may be shaped such that the portion of the pin(s) 108 thermally coupled to the TEC(s) 110 has a larger surface area than the portion of the pin(s) 108 thermally coupled to the hot spot(s) 106 and microelectronic device 102.

In one embodiment, the pin(s) 108 may be rectangular. The following dimensions are described in relation to FIG. 1. The height refers to the direction from the bottom to the top of the page of FIG. 1, the length refers to the direction in and out of the page of FIG. 1, and the width refers to the direction from the left to the right of the page of FIG. 1. The height (up and down) of the pin(s) 108 may range between about 1-3 mm and the length (in and out of page) of the pin(s) 108 may range between about 1-3 mm. The length of the pin(s) 108 may be substantially greater than the width (left and right).

In another embodiment, the portion of the pin(s) 108 coupled to the microelectronic device 102 and hot spot 106 may have a length of about 1 mm and height of about 0.4 mm; the portion of the pin(s) 108 coupled to the TEC(s) 110 may have a length of about 5 mm and height of about 1.5 mm. The width of both portions of the pin(s) 108 may be roughly equivalent and may be substantially smaller than 1 mm. All dimensions cited are rough approximations and will naturally vary according to temperature requirements and size of the microelectronic device 102 among other factors.

The one or more pin(s) 108 may comprise a thermally conductive material such as diamond, for example. In another embodiment, the pin(s) 108 may comprise copper. The thermally conductive material may be a reliable, high performance, heat spreading material with no moving parts. Diamond may provide thermal conductivity about 2.5 times greater than copper. In addition, diamond may provide benefits as an electrical insulator. For example, diamond may not have to be shielded with electrically insulative material when coupled with TEC(s) 110 and associated electrical interconnects.

In one embodiment, the pin(s) 108 may be thermally coupled to the hot spot(s) 106 using a solder attachment method. A diamond pin(s) 108 may have a metallized surface to facilitate solder attachment. Solder attachment may involve any of various solderable materials, including fusible alloys such as lead or tin, to join parts. In one embodiment, an Indium-based alloy is used in a solder attachment process to couple one or more thermally conductive pin(s) 108 to one or more hot spot(s) 106 of a microelectronic device 102. In another embodiment, one or more thermally conductive pin(s) 108 are thermally coupled to one or more hot spot(s) 106 of a microelectronic device 102 by a thermal grease bond. In another embodiment, one or more thermally conductive pin(s) 108 are thermally coupled to one or more hot spot(s) 106 of a microelectronic device 102 by a thermal epoxy.

According to one embodiment, the one or more thermally conductive pin(s) 108 may be thermally coupled to one or more TEC(s) 110 to remove heat. A TEC 110 may have a cold side where heat is absorbed by electrons as they pass from a low energy level in a p-type semiconductor element, to a higher energy level in an n-type semiconductor element. A power supply may provide the energy to move the electrons through the system. At a hot side, energy may be expelled to a heat sink 120 as electrons move from a high energy level element (n-type) to a lower energy level element (p-type). In one embodiment, a cold side of one or more TEC(s) 110 is thermally coupled to one or more thermally conductive pin(s) 108 and a hot side of one or more TEC(s) 110 is thermally coupled to a heat spreader 104.

TEC(s) 110 may comprise a variety of materials including, but not limited to, Bismuth Telluride, super-lattice materials, semiconductor materials, ceramics, and organic materials. The TEC(s) 110 may be conventional TEC(s) or thin-film TEC(s), but are not limited to these types. Using thermally conductive pin(s) 108 to provide a heat transfer path from the hot spot(s) 106 may enable sufficient heat removal using conventional TEC(s) 110 as opposed to more costly types. Conventional TEC(s) 110 may help extract heat from hot spot(s) 106 by suppressing pin 108 temperature. In one embodiment, two TECs 110 are positioned as depicted in FIG. 1, one on each side of the thermally conductive pin(s) 108. TEC(s) 110 may be embedded in heat spreader 104. In another embodiment, an additional TEC may be positioned between the pin(s) 108 and heat sink 120 to facilitate heat removal away from hot spot(s) 106 and thermally conductive pin(s) 108.

TEC(s) 110 may be thermally coupled to thermally conductive pin(s) 108 using various techniques. In one embodiment, the pin(s) 108 may be thermally coupled to the TEC(s) 110 using a solder attachment method. A diamond pin(s) 108 may have a metallized surface to facilitate solder attachment. Solder attachment may involve any of various solderable materials, including fusible alloys such as lead or tin, to join parts. In one embodiment, an Indium-based alloy is used in a solder attachment process to couple one or more thermally conductive pin(s) 108 to one or more TEC(s) 110. In another embodiment, one or more thermally conductive pin(s) 108 are thermally coupled to one or more TEC(s) 110 by a thermal grease bond. In another embodiment, one or more thermally conductive pin(s) 108 are thermally coupled to one or more TEC(s) 110 by a thermal epoxy. In other embodiments, TEC(s) 110 are further thermally coupled to microelectronic device 102 and heat sink 120 using solder bond(s) 116.

In another embodiment, one or more TEC(s) 110 may be thermally coupled to a heat spreader 104. Heat spreader 104 may be further coupled to a heat sink 120, 122$_{1 \ldots n}$. As used in this description, "heat spreader" 104 is a general term that includes a variety of heat spreading devices such as an integral heat spreader (IHS), heat sinks, and/or heat pipes among others. Heat spreader 104 depicted in FIG. 1 may be of the IHS variety, but the invention is not limited in this regard. TEC element(s) 110 may be thermally coupled to heat spreader 104 so that they are located over, near or adjacent to one or more thermally conductive pin(s) 108 to provide cooling. The dimensions (i.e. —length, width, and thickness) of the TEC 104 may be selected according to power dissipation and temperature requirements of the microelectronic device 102 and targeted hot spot(s) 106.

Localized TEC elements 110 may provide a benefit of providing directed cooling to particular hot spot(s) 106 of a microelectronic die 102 while consuming less power and space than a TEC element that generally provides cooling for an entire die, for example. Such localized cooling may improve overall cooling efficiency and reduce the density factor, which is a thermal metric of temperature non-uniformity across a microelectronic device 102. Creating a more uniform temperature profile across a microelectronic device 102 may allow the device to run at a higher frequency.

A variety of suitable techniques may be used to couple one or more TEC(s) 110 to a heat spreader 104 including, but not limited to, sputtering, plating, screening, solder attachment, and direct attachment methods. Suitable locations for coupling one or more TEC(s) 110 to a heat spreader 104 may vary based on local cooling needs and design of the microelectronic device 102.

Solder attachment may involve any of various solderable materials, including fusible alloys such as lead or tin, to join parts. In one embodiment, an Indium-based alloy is used in a solder attachment process to couple one or more TEC(s) 110 to a heat spreader 104.

Direct attachment may involve a fabrication process to integrate a densely packed thin-film TEC 110 on a heat spreader 104 surface. Such process may comprise patterning a heat spreader 104 with electrodes and fabricating p and/or n type materials via sputtering, molecular beam epitaxy, crystal growth, or any other suitable method. Direct attachment may involve any suitable method for fabricating a TEC 110 on a heat spreader 104 surface.

Figure 2:
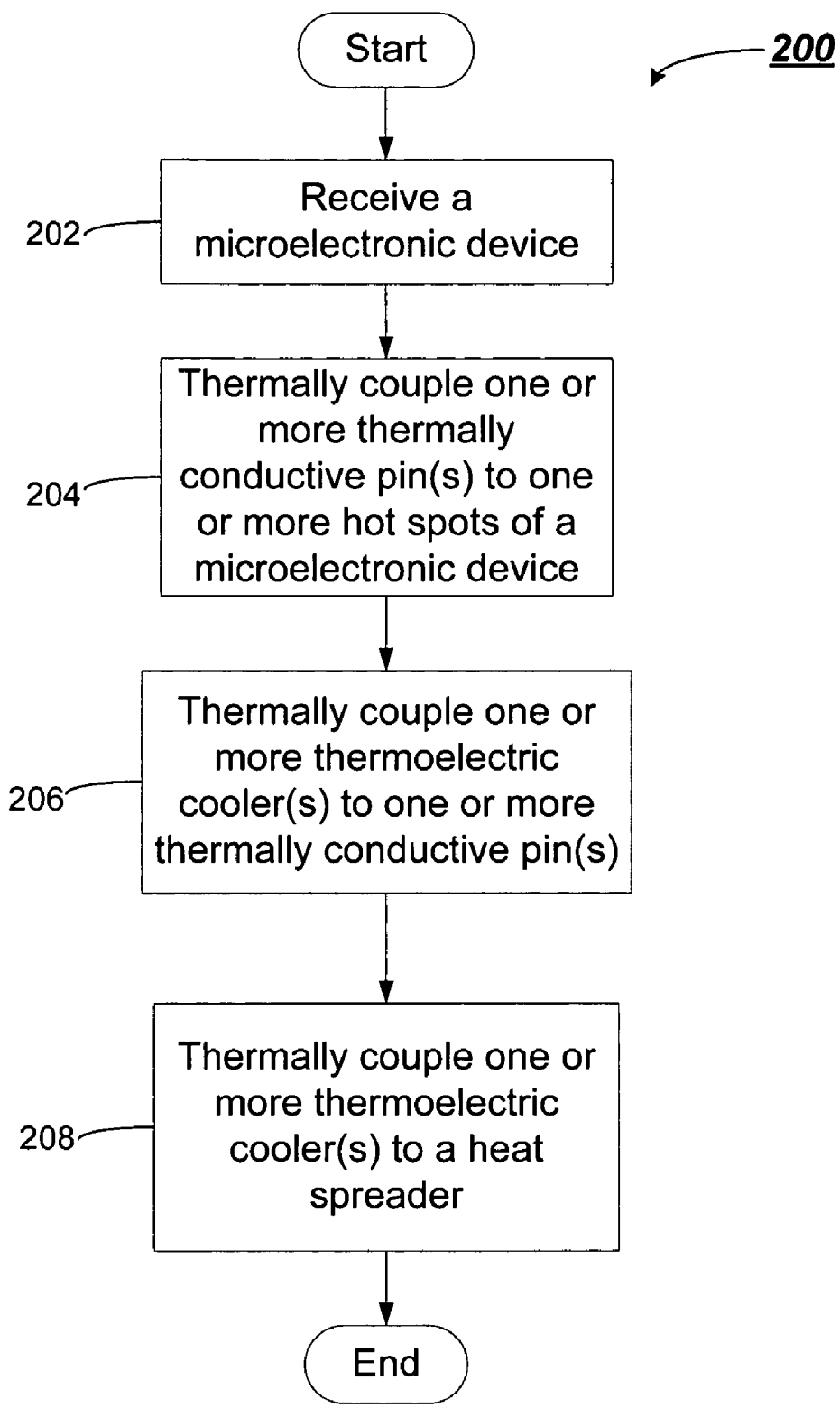

FIG. 2 is a flow chart of an example method 200 to fabricate a localized microelectronic cooling system, according to but one example embodiment. In an embodiment, a method may comprise receiving a microelectronic device 202, thermally coupling one or more thermally conductive pin(s) to one or more hot spot(s) of a microelectronic device 204, thermally coupling one or more TEC(s) to one or more thermally conductive pin(s) 206, and thermally coupling one or more TEC(s) to a heat spreader 208. Receiving a microelectronic device 202 may comprise receiving an integrated circuit die, such as a processor for example. Such method 200 may fabricate a cooling system that facilitates the temperature reduction for particular hot spot(s) on a die, for example.

The one or more pin(s) may be formed by cutting the pin(s) from a sheet of thermally conductive material such as diamond or copper, for example. Diamond pin(s) may be formed by a laser-cutting method or any other suitable method for cutting diamond. Diamond may provide thermal conductivity about 2.5 times greater than copper. In addition, diamond may provide benefits as an electrical insulator. For example, diamond may not have to be shielded with electrically insulative material when coupled with TEC(s) and associated electrical interconnects.

Thermally coupling the pin(s) to the hot spot(s) of a microelectronic device 204, such as a processor or other integrated circuit die, may occur during a chip assembly process. A trench or hole may be etched into the backside of a die near one or more hot spot(s) to enable inserting and thermally coupling the pin(s) to the one or more hot spot(s) 204.

The pin(s) may be thermally coupled to hot spot(s) 204 by a solder-metallurgical bond to a die. In one embodiment, the pin(s) may be thermally coupled to the hot spot(s) 204 using a solder attachment method. One or more diamond pin(s) may have a metallized surface to facilitate solder attachment. Solder attachment may involve any of various solderable materials, including fusible alloys such as lead or tin, to join parts. In one embodiment, an Indium-based alloy is used in a solder attachment process to couple one or more thermally conductive pin(s) to one or more hot spot(s) of a microelectronic device 204. In another embodiment, one or more thermally conductive pin(s) are thermally coupled to one or more hot spot(s) of a microelectronic device 204 by a thermal grease bond. In another embodiment, one or more thermally conductive pin(s) are thermally coupled to one or more hot spot(s) of a microelectronic device 204 by a thermal epoxy.

The pin(s) may be thermally coupled to TEC(s) 206 by a solder-metallurgical bond. In one embodiment, the pin(s) may be thermally coupled to TEC(s) 206 using a solder attachment method. One or more diamond pin(s) may have a metallized surface to facilitate solder attachment. Solder attachment may involve any of various solderable materials, including fusible alloys such as lead or tin, to join parts. Low thermal resistance and good contact may improve the heat transfer ability of a solder bond. In one embodiment, an Indium-based alloy is used in a solder attachment process to couple one or more thermally conductive pin(s) to one or TEC(s) 206. In another embodiment, one or more thermally conductive pin(s) are thermally coupled to one or more TEC(s) 206 by a thermal grease bond. In another embodiment, one or more thermally conductive pin(s) are thermally coupled to one or more TEC(s) 206 by a thermal epoxy.

In one embodiment, manufacturing equipment may receive a microelectronic device 202 and thermally couple one or more thermally conductive pin(s) to one or more hot spot(s) of a microelectronic device 204. In another embodiment, one or more thermally conductive pin(s) may be thermally coupled to one or more hot spot(s) of a microelectronic device 204 before one or more thermally conductive pin(s) are thermally coupled to one or more TEC(s) 206. In another embodiment, one or more thermally conductive pin(s) may be thermally coupled to one or more TEC(s) 206 before one or more thermally conductive pin(s) are thermally coupled to one or more hot spot(s) of a microelectronic device 204. In another embodiment, manufacturing equipment receives a microelectronic device 202 to thermally couple one or more thermally conductive pin(s) to one or more hot spot(s) of the microelectronic device 204 and, subsequently, a different set of manufacturing equipment receives the microelectronic device 202 to thermally couple one or more TEC(s) to the one or more thermally conductive pin(s) 206.

In one embodiment, one or more TEC(s) may be thermally coupled to a heat spreader 208 prior to thermally coupling one or more TEC(s) to one or more thermally conductive pin(s) 206. One or more TEC(s) may be remotely embedded in a heat spreader prior to thermally coupling one or more TEC(s) to one or more thermally conductive pin(s) 206. In another embodiment, one or more TEC(s) may be thermally coupled to a heat spreader 208 after thermally coupling one or more TEC(s) to one or more thermally conductive pin(s) 206. The heat spreader may be thermally coupled to a heat sink.

Thermally coupling one or more TEC(s) to a heat spreader 208 may comprise thermally coupling a hot side of the one or more TEC(s) to a heat spreader. Thermally coupling one or more TEC(s) to one or more thermally conductive pin(s) 206 may comprise thermally coupling a cold side of the one or more TEC(s) to the one or more thermally conductive pin(s).

In various embodiments, thermally coupling one or more TEC(s) to a heat spreader 208 may be accomplished by sputtering, plating, screening, solder attachment, or direct attachment methods. In one embodiment, an Indium-based alloy is used in a solder attachment process to thermally couple one or more TEC(s) to a heat spreader 208. In another embodiment, a direct attachment method comprising patterning a heat spreader with electrodes and fabricating p or n type materials via sputtering, molecular beam epitaxy, and/or crystal growth is used to thermally couple one or more TEC(s) to a heat spreader 208.

Pin(s), TEC(s), heat spreader, microelectronic device, and other components of method 200 may accord with various embodiments already described in cooling system 100.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A microelectronic cooling apparatus comprising:
   a microelectronic device; and
   one or more thermally conductive pin(s) thermally coupled to one or more hot spot(s) of the microelectronic device to provide localized cooling;
   two thermoelectric cooler(s) disposed one on each side of each of the one or more thermally conductive pin(s), wherein the two thermoelectric cooler(s) are vertically connected between a heat spreader and the microelectronic device; and
   wherein a hot side of the two thermoelectric cooler(s) is thermally coupled to the heat spreader and a cold side of the two thermoelectric cooler(s) is thermally coupled to the one or more thermally conductive pin(s).

2. A microelectronic cooling apparatus according to claim 1, further comprising:
   wherein the two thermoelectric cooler(s) thermally coupled to the one or more thermally conductive pin(s) remove heat.

3. A cooling apparatus according to claim 1, wherein the one or more thermally conductive pin(s) are thermally coupled to the one or more hot spot(s) of the microelectronic device by a solder attachment method.

4. A cooling apparatus according to claim 1, wherein the one or more thermally conductive pin(s) are thermally coupled to the one or more hot spot(s) of the microelectronic device by a thermal grease bond.

5. A cooling apparatus according to claim 1, wherein the one or more thermally conductive pin(s) comprise diamond.

6. A cooling apparatus according to claim 1, wherein the one or more thermally conductive pin(s) comprise copper.

7. A cooling apparatus according to claim 1, wherein the microelectronic device is a die.

8. A cooling apparatus according to claim 1, further comprising:
   a heat sink thermally coupled to the heat spreader.

9. A method comprising:
   thermally coupling one or more thermally conductive pin(s) to one or more hot spot(s) of a microelectronic device;
   attaching two thermoelectric cooler(s) one on each side of each of the one or more thermally conductive pin(s), wherein the one or more thermoelectric cooler(s) are vertically connected between a heat spreader and the microelectronic device.

10. A method according to claim 9, further comprising:
    wherein attaching the two thermoelectric cooler(s) comprises thermally coupling the two thermoelectric cooler(s) to the one or more thermally conductive pin(s) to remove heat.

11. A method according to claim 9, wherein thermally coupling one or more thermally conductive pin(s) to one or more hot spot(s) of the microelectronic device comprises a solder attachment method.

12. A method according to claim 9, wherein thermally coupling one or more thermally conductive pin(s) to one or more hot spot(s) of the microelectronic device comprises a thermal grease bond.

13. A method according to claim 9, wherein thermally coupling one or more thermally conductive pin(s) to one or more hot spot(s) of the microelectronic device includes one or more thermally conductive pin(s) comprising diamond.

14. A method according to claim 9, wherein thermally coupling one or more thermally conductive pin(s) to one or more hot spot(s) of the microelectronic includes one or more thermally conductive pin(s) comprising copper.

15. A method according to claim 9, wherein the microelectronic device comprises a die.

16. A method according to claim 9, further comprising:
    thermally coupling a hot side of each of the two thermoelectric cooler(s) to the heat spreader; and
    thermally coupling a cold side of each of the two thermoelectric cooler(s) to the one or more thermally conductive pin(s).

17. A method according to claim 16, further comprising:
    thermally coupling a heat sink to the heat spreader.

18. A cooling system comprising:
    a microelectronic device;
    one or more thermally conductive pin(s) thermally coupled to one or more hot spot(s) of the microelectronic device to provide localized cooling;
    two thermoelectric cooler(s) disposed one on each side of each of the one or more thermally conductive pin(s), wherein the two thermoelectric cooler(s) are vertically connected between a heat spreader and the microelectronic device; and
    another device electrically coupled to the microelectronic device.

19. A cooling system according to claim 18, wherein the another device is a memory device and the microelectronic device is an integrated circuit die.

20. A microelectronic cooling system according to claim 18, further comprising:
    wherein the two thermoelectric cooler(s) thermally coupled to the one or more thermally conductive pin(s) remove heat.

21. A cooling system according to claim 18, wherein the one or more thermally conductive pin(s) comprise diamond.

22. A cooling system according to claim 18, further comprising:

wherein a hot side of each of the two thermoelectric cooler(s) is thermally coupled to the heat spreader and a cold side of each of the two thermoelectric cooler(s) is thermally coupled to the one or more thermally conductive pin(s).

23. A cooling system according to claim 22, further comprising:
a heat sink thermally coupled to the heat spreader.

* * * * *